United States Patent [19]

Sargent et al.

[11] 4,032,996
[45] July 5, 1977

[54] SEALING APPARATUS FOR TOILET

[75] Inventors: Frak T. Sargent; John M. Antos, both of Ann Arbor, Mich.

[73] Assignee: Thetford Corporation, Ann Arbor, Mich.

[22] Filed: Aug. 4, 1976

[21] Appl. No.: 711,434

[52] U.S. Cl. .................................... 4/17; 4/76; 4/10; 4/78; 4/85

[51] Int. Cl.² ............... E03D 5/01; E03D 5/012; E03D 5/09

[58] Field of Search .............. 4/17, 10, 76, 77, 78, 4/79, 80, 84, 85, 89, 115, 12, 128, 129, 132; 251/203

[56] References Cited

UNITED STATES PATENTS

| | | | |
|---|---|---|---|
| 189,782 | 4/1877 | Pohley | 4/77 |
| 754,733 | 3/1904 | Allen | 4/85 |
| 1,779,642 | 10/1930 | Schumacher | 4/85 |
| 3,454,967 | 7/1969 | Corliss | 4/77 |
| 3,570,018 | 3/1971 | Sargent et al. | 4/115 |
| 3,747,130 | 7/1973 | Sargent | 4/17 |
| 3,905,049 | 9/1975 | Stokes et al. | 4/10 |
| 3,986,216 | 10/1976 | Davis | 4/10 |

FOREIGN PATENTS OR APPLICATIONS

| | | | |
|---|---|---|---|
| 1,285,321 | 1/1962 | France | 4/252 |

*Primary Examiner*—Henry K. Artis
*Attorney, Agent, or Firm*—Olsen and Stephenson

[57] ABSTRACT

An improved sealing mechanism for closing the bottom opening of a toilet bowl and adapted to be moved between open and closed positions with a minimum of human effort. The mechanism includes a movable blade and an elastic seal in the form of a curtain that functions to wipe foreign material from the blade when the latter is moved between open and closed positions, the curtain also functioning to provide a seal when the blade is in its closed position. The blade is supported so that when in its closed position it will always align itself with respect to the curtain to maintain an optimum seal. The blade is pivotally supported on an arm of a vertically disposed crank which is spring-actuated to an upper position and which can be depressed and pivoted for moving the blade between its closed and open positions.

14 Claims, 10 Drawing Figures

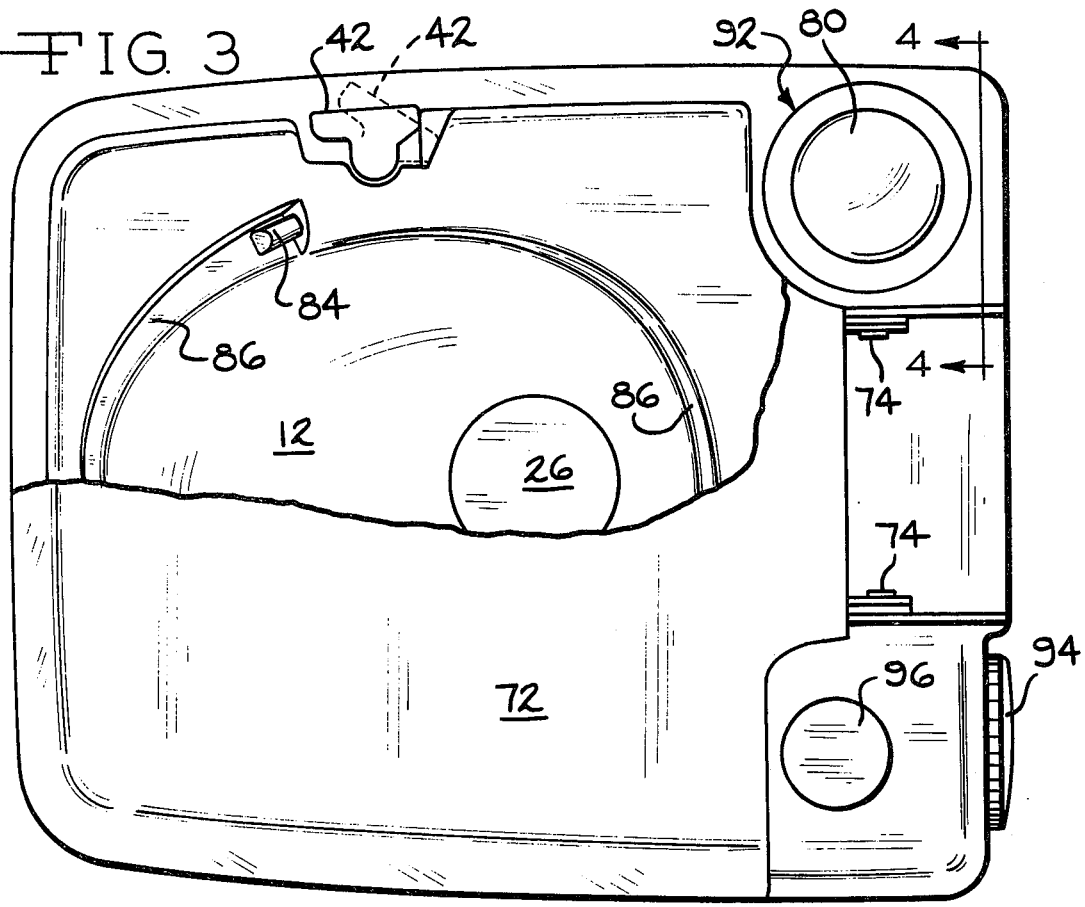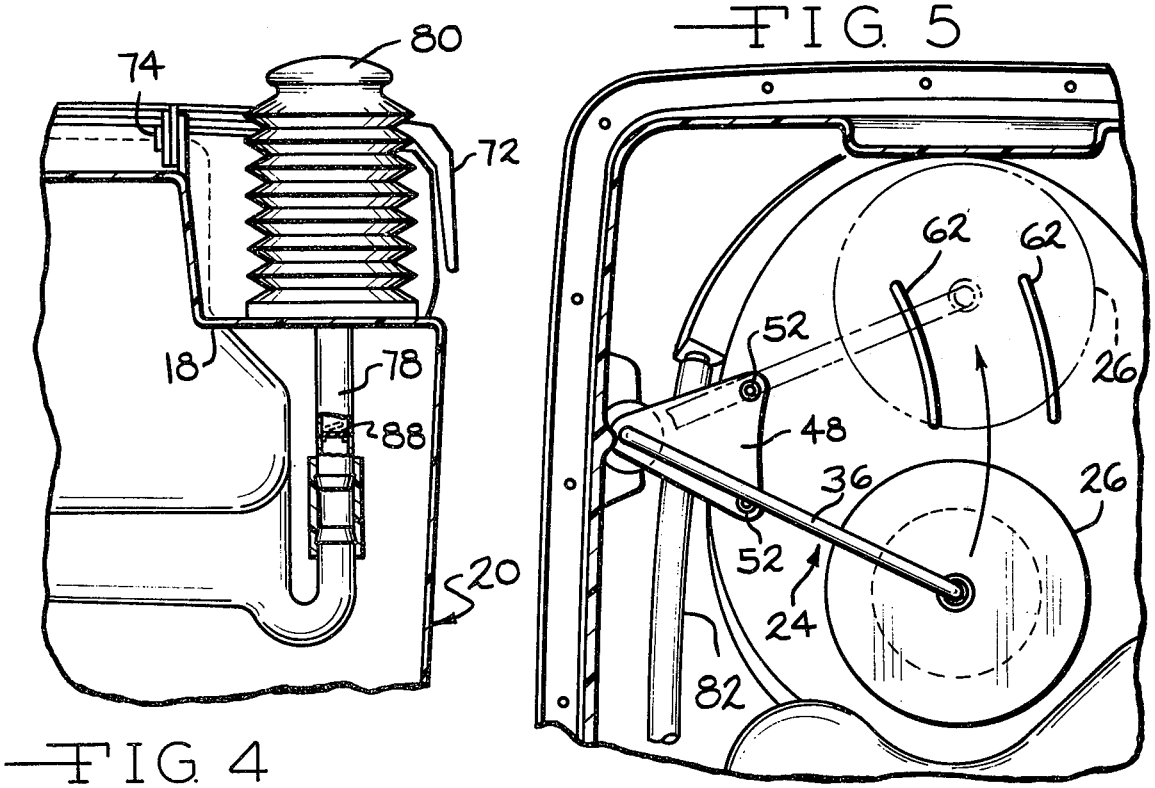

SEALING APPARATUS FOR TOILET

BACKGROUND OF THE INVENTION

The present invention relates to sealing mechanisms for toilets which are particularly, but not exclusively adapted for use with toilets that are portable.

It is known to provide self-contained portable toilets having holding tanks, flush water storage tanks and flush mechanisms of the types shown, for example, in U.S. Pat. Nos. 3,570,018 and 3,747,130. Products of the types disclosed in these patents have proved to be very popular and commercially successful in the camping and recreational fields. Significant cost factors of these products are the seal mechanisms that must be used so that to expand the existing market for products of this character, there is a need for an improved sealing mechanism that is characterized by its low cost, ease of operation and durability.

SUMMARY OF THE INVENTION

The present invention has overcome the inadequacies of the prior art and provides a toilet apparatus which meets the high standard of performance required and which can be constructed at relatively lower cost than the prior art structures heretofore known in this field.

According to one form of the present invention, toilet apparatus is provided comprising a bowl having at its bottom a discharge outlet, a housing supporting the bowl, and a sealing mechanism for closing and opening the bowl outlet. The sealing mechanism comprises a blade of larger area than said bowl outlet, a crank having a vertical shaft supported in said housing for rotary movement about its vertical axis, a crank arm radiating from the shaft and supporting the blade, actuating means connected to the shaft at a location accessible from the outside of the housing for rotating the shaft between a first position wherein the blade is under the bowl outlet for closing the bottom of the bowl and a second position wherein the blade is at one side of the bowl outlet, a seal member mounted in sealing relationship to the bottom of the bowl around said outlet, and spring means urging the shaft axially upward so that the blade will be seated in sealing relationship against the seal member when the blade is in its closed position.

The bowl has a downwardly projecting flange defining the outlet, and the seal member is an elastomeric sleeve attached to and projecting below the lower edge of the flange so as to provide an elastic curtain. The blade is movable in a horizontal plane containing the projecting portion or elastic curtain so that when the blade is moved in a horizontal plane, the curtain can scrape along the top surface of the blade to clean off foreign particles.

The blade has a socket that opens in a downward direction on its lower surface, and the blade is supported on a finger which extends upward from the crank arm and fits into the socket. By virtue of this arrangement, the blade is balanced on the finger in a floating relationship so that it will always adjust itself to provide a uniform and effective seal with respect to the elastic curtain.

The actuating means is located at an external portion of the housing and the crank is supported in suspended relationship from this portion of the housing for rotation about the axis of the shaft. A guide plate is mounted within the housing to aid in maintaining the vertical shaft in proper alignment and to limit the shaft to rotary and axial movements.

As indicated, the blade is supported on the finger of the crank arm, and to assure that it will not inadvertently fall from the finger when moved to an open position, suitable guide rails are provided in the housing to prevent excessive tilting of the blade. Also, in the event that pressure should build up within the holding tank of the toilet apparatus, vent means is provided which is adapted to be opened initially when the sealing mechanism is first actuated for opening the bowl outlet. The toilet apparatus may include a conventional flush water tank and a manually actuated flush mechanism for discharging flush water into the bowl.

Other objects of this invention will appear in the following description and appended claims, reference being had to the accompanying forming a part of this specification wherein like reference characters designate corresponding parts in the several views.

BRIEF DESCRIPTION OF THE DRAWINGS

FIG. 3 is an enlarged top plan view of the toilet apparatus illustrated in FIG. 1, with portions removed to show the top of the bowl and actuating means for the seal member;

FIG. 4 is an enlarged fragmentary section taken on the lines 4—4 of FIG. 3;

FIG. 5 is an enlarged fragmentary section taken on the lines 5—5 of FIG. 1;

DESCRIPTION OF THE PREFERRED EMBODIMENTS

Figure 1:
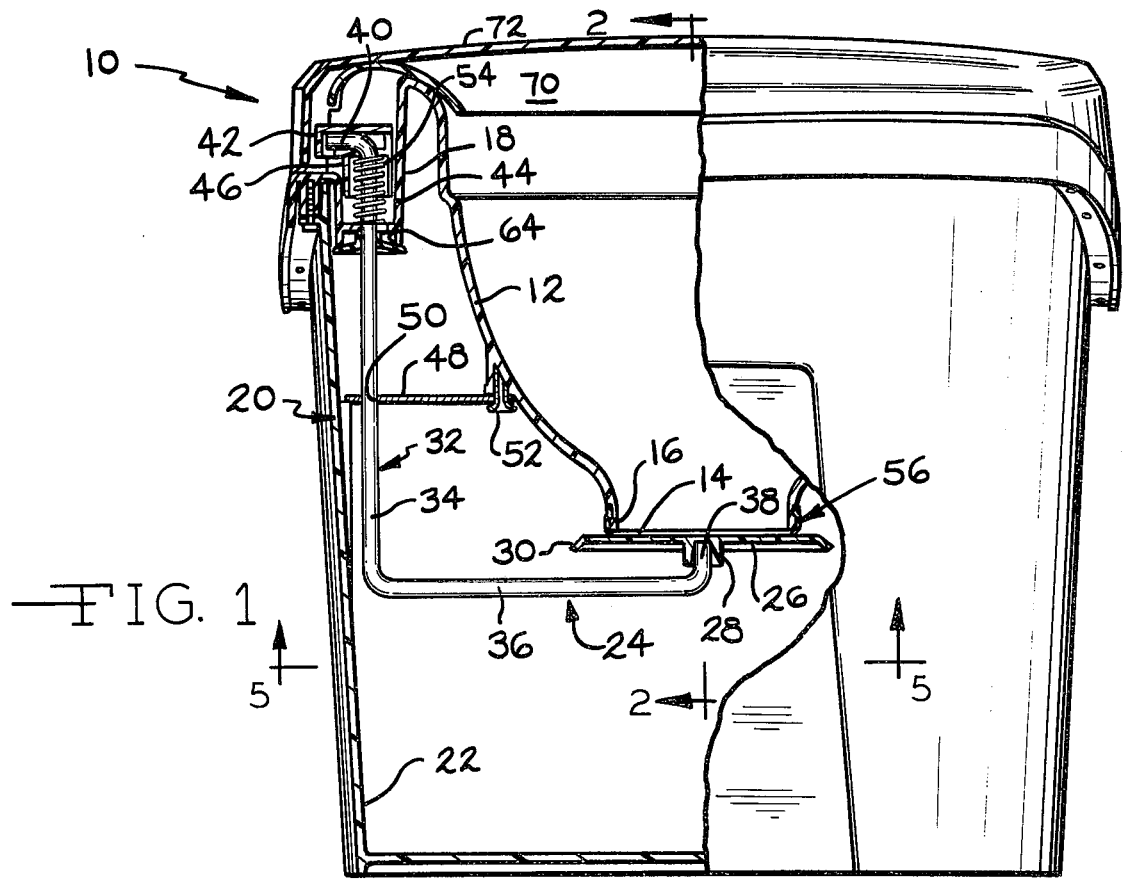
FIG. 1 is a front elevational view of toilet apparatus embodying the present invention, portions being broken away to illustrate in section the sealing mechanism for closing and opening the bowl outlet.
Figure 2:
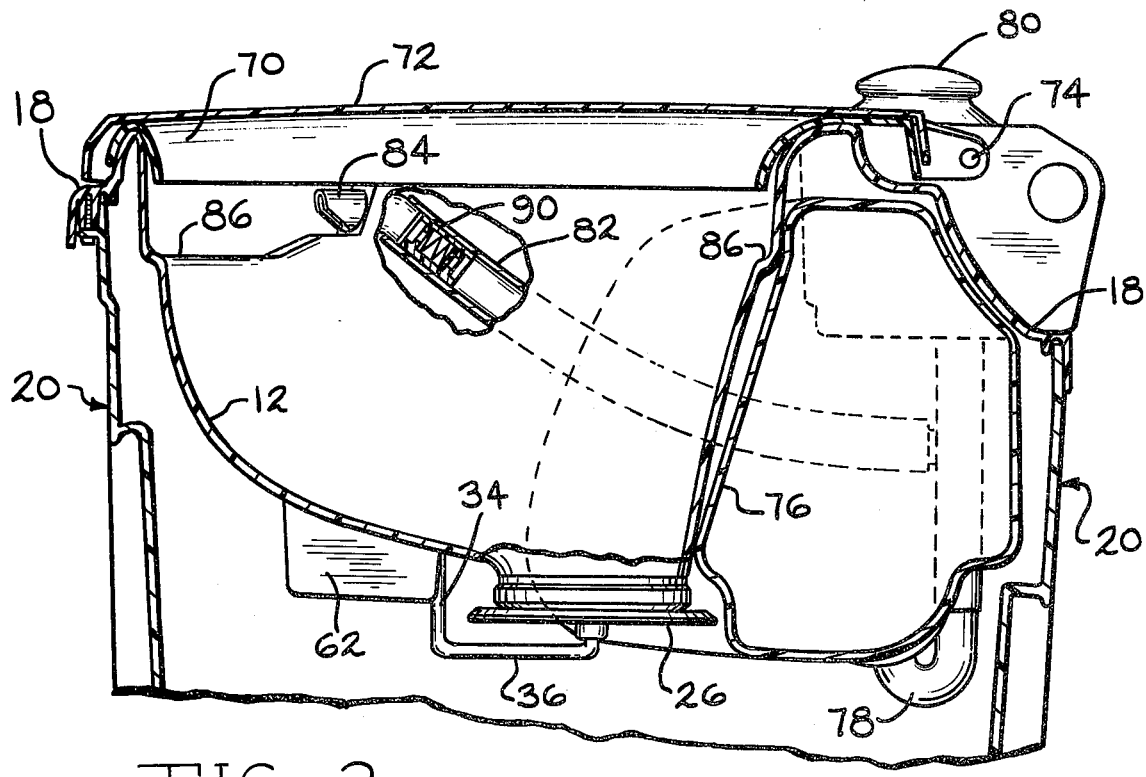
FIG. 2 is an enlarged fragmentary section taken on the lines 2—2 of FIG. 1.

Before explaining the present invention in detail, it is to be understood that the invention is not limited in its application to the details of construction and arrangement of parts illustrated in the accompanying drawings, since the invention is capable of other embodiments and of being practiced or carried out in various ways. Also, it is to be understood that the phraseology or terminology employed herein is for the purpose of description and not of limitation.

Referring now to the drawings, the invention will be described in greater detail. The toilet apparatus 10 comprises the bowl 12 having at its bottom a discharge outlet 14 defined by the downwardly projecting flange 16. The upper end of the bowl 12 is open and has an outwardly directed peripheral flange 18 that is supported on and secured to the housing 20. The housing 20 defines a holding tank 22 into which waste material from the bowl 12 can be discharged when the sealing mechanism 24 is in an open position.

The sealing mechanism 24 can move between open and closed positions for opening and closing the bowl outlet 16. The sealing mechanism 24 includes a blade 26 of larger area than the bowl outlet 16, and it has a downwardly opening socket 28 located centrally of the blade 26 and a beveled edge 30 around the pheriphery of the blade 26. The sealing mechanism also includes a crank a 32 that has a vertical shaft 34, a crank arm 36 terminating at its radially outer end in a finger 38 which extends into the socket 28 for supporting the blade 26, and the crank has a relatively short arm 40 at its upper end on which a handle or actuating means 42 is mounted. As can be seen in FIG. 1, the peripheral flange 18 has a cylindrical portion 44 into which a piston portion 46 of the actuating means 42 can reciprocate axially and can rotate about the axis of the shaft 34.

Figure 8:
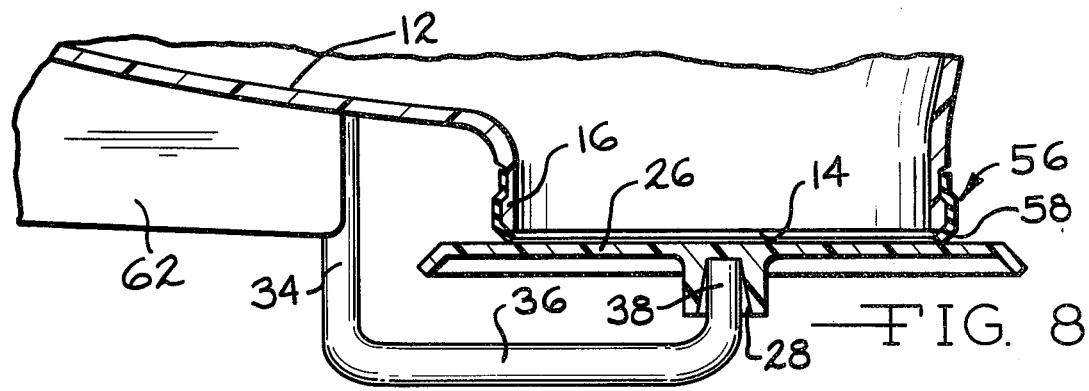
FIG. 8 is a fragmentary section showing the blade in its closed position, corresponding to the solid line position of the actuating means shown in FIG. 6.
Figure 9:
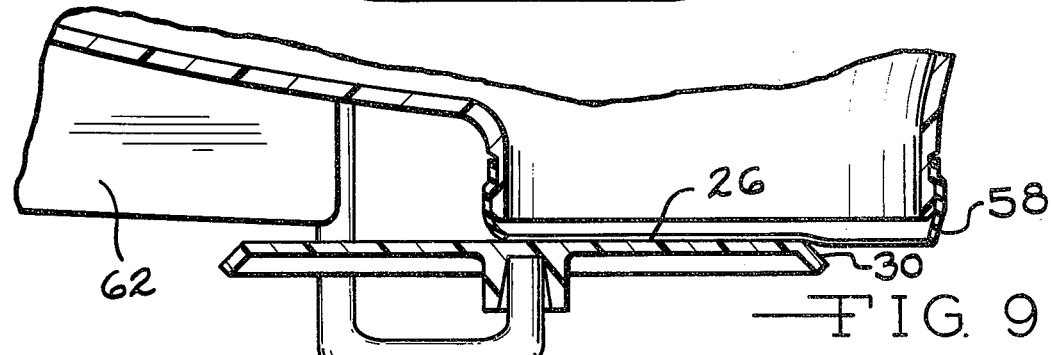
FIG. 9 is a view similar to FIG. 8, but showing the blade in a partially open position corresponding to the broken line position of the actuating means shown in FIG. 6.

A guide plate 48, which has an aperture 50 therein through which the shaft 34 passes, is secured in place under the bowl 12 by means of a pair of rivets 52 which are heat welded in place on the bottom of the bowl 12, as can be seen in FIGS. 1 and 5. The apertured plate 48 and the cylindrical portion 44 function to limit the shaft 32 to rotary and axial movements. A spring means 54 is disposed between the actuating means 42 and the peripheral flange 18 to urge the crank shaft 32 and thereby the blade 26 and actuating means 42 to the positions shown in FIG. 1 and FIG. 8.

Figure 7:
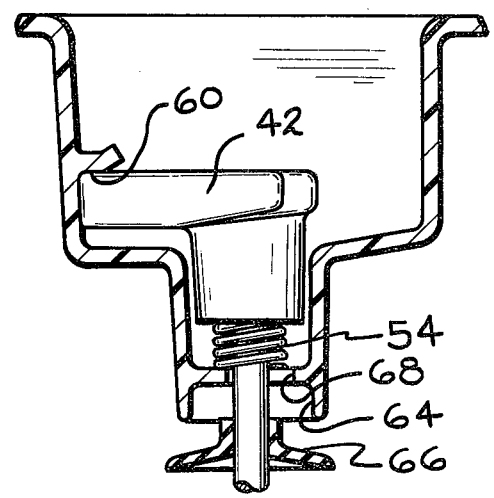
FIG. 7 is a figure similar to FIG. 6, but showing the actuating means in a third position of its movement.
Figure 10:
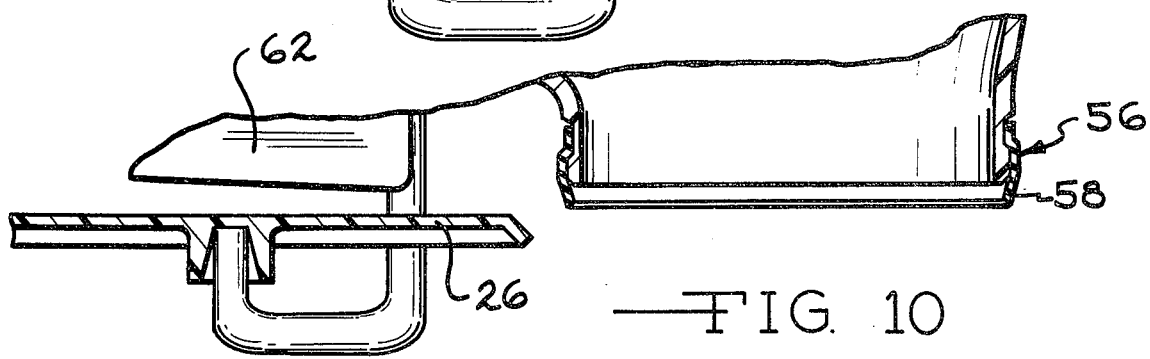
FIG. 10 is a view similar to FIGS. 8 and 9, but showing the blade in its open position corresponding to the position of the actuating means shown in FIG. 7.

A seal member 56 is mounted in sealing relationship to the bottom of the bowl 12 around the outlet 14. The seal member 56 is an elastomeric sleeve which is stretched around the outer periphery of the flange 16 and projects below the lower edge of this flange to provide a projecting portion or an elastic curtain 58 below the lower edge of the flange. In its condition shown in FIG. 10, when the blade 26 has been moved to its open position, the elastic curtain 58 provides an inward tapered lower edge. When the sealing mechanism 24 is moved from the closed position shown in FIG. 8 and in solid lines in FIG. 5 to the open position shown in FIG. 10 and in broken lines in FIG. 5, the blade 26 will move or travel in a horizontal plane containing the projecting portion or elastic curtain 58 so that the curtain can scrape along the top surface of the blade 26 to clean off foreign particles. For the purpose of moving the blade 26 in this path of travel, the actuating means 42 can initially be depressed a sufficient amount to pass under the vertical stop member 60. Thereafter, when the blade 26 is in its fully open position the actuating means 42 will be in the broken line position shown in FIG. 3 and in the solid line position shown in FIG. 7 so that it can be released, and the spring means 54 will urge the actuating means 42 against the stop member 60 to retain the sealing mechanism 24 in a fixed position. The blade 26 can be returned to the closed position by depressing and reversing the direction of rotation of actuating means 42, and on returning the beveled edge 30 of plate 26 will engage and slide under curtain 58.

From the above description, it will be recognized that the blade 26 is in a floating position on the tip of the finger 38 so that it can readily adjust itself to provide a most effective seal with the elastic curtain 58 when the sealing mechanism is moved to the closed position under the bowl outlet 16. To assure that the blade 26 does not fall off the finger 38 when unusual conditions occur that might cause tilting of the blade 26, guide rails 62 are provided which project downward from the bottom surface of bowl 12 to limit tilting of blade 26 to an allowable amount.

Figure 6:
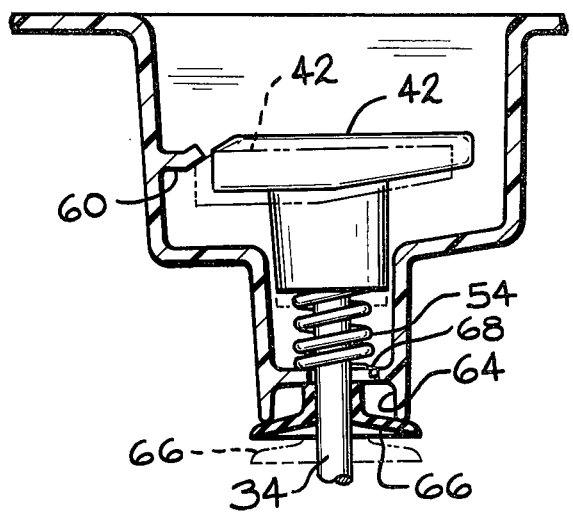
FIG. 6 is a fragmentary vertical section taken through the housing of the toilet apparatus at the actuating means for the seal member, showing the actuating means in two of its positions of movement.

The peripheral flange 18 cooperates with the housing 20 to provide a vent opening 64 for releasing pressures that may be built up within the holding tank 22 when the actuating means 42 is initially depressed for moving the sealing mechanism 24 to its open position. A vent seal 66 is supported on the shaft 34 closing the vent opening 64 and it is adapted to move downward as shown by the broken lines in FIG. 6 when the actuating means 42 is initially lowered to the broken line position. This action will allow venting through the port 68.

The toilet apparatus 10 includes a conventional seat 70 and cover 72 which are pivotally mounted at the pins 74. The toilet apparatus 10 also includes the flush water tank 76 which is mounted within the housing 20 on the rearward side of the bowl 12 to provide flush water for flushing the bowl 12. The flush water tank 76 also serves as an abutment to prevent movement of the blade 26 beyond a desired position for proper sealing with the curtain 58 when the blade 26 is moved to its closed position. The flush water tank 76 has a suction line 78 in communication therewith which leads to the bellows pump 80, and a discharge line 82 also is in communication with the bellows pump 80 for discharging flush water by way of the nozzle 84 to the spiral ledge 86 that extends around the bowl 12. The suction line 78 and the discharge line 82 have conventional check valves 88 and 90 to provide uniform directional flow of the flush water from the flush water tank 76 through the bellows pump 80 to the discharge nozzle 84. Thus, the suction and discharge lines 78 and 82 and the bellows pump 80 provide a manually actuating flush mechanism 92 of a conventional type for use with the toilet apparatus. This manually actuating flush mechanism 92 can be operated independently of the sealing mechanism 24 either when the sealing mechanism 24 is in its open or closed positions.

In the conventional, a closure cap 94 is provided which can be removed for discharging the contents of the holding tank 22, and a closure cap 96 is provided which can be removed when it is desired to fill the flush water tank 76.

It is claimed:
1. Toilet apparatus comprising a bowl having at its bottom a discharge outlet, a housing supporting said bowl, and a sealing mechanism for closing and opening said bowl outlet, said sealing mechanism comprising a blade of larger area than said bowl outlet, a crank having a vertical shaft mounted in said housing for rotary movement about its vertical axis, a crank arm radiating from said shaft and supporting said blade, actuating means connected to said shaft at a location accessible from the outside of said housing for rotating said shaft between a first position wherein said blade is under said bowl outlet for closing the bottom of the bowl and a second position wherein said blade is at one side of said bowl outlet, a seal member mounted in sealing relationship to the bottom of said bowl around said outlet, and spring means urging said shaft axially upward so that the blade will be seated in sealing relationship against said seal member when the blade is in its closed position.

2. Toilet apparatus that is defined in claim 1, wherein said bowl has a downwardly projecting flange defining said outlet, and said seal member is an elastomeric sleeve attached to and projecting below the lower edge of said flange, and said blade is movable in a horizontal plane containing the projecting portion of said elastomeric sleeve.

3. Toilet apparatus that is defined in claim 1, wherein said blade has a socket that opens downward on its lower surface, and said crank arm has a finger that is directed upward and extends into said socket by which said blade is supported on said crank arm.

4. Toilet apparatus that is defined in claim 3, wherein the vertical axis of said socket passes substantially through the center of gravity of said blade so that the blade is balanced on the upper tip of said finger.

5. Toilet apparatus that is defined in claim 4, wherein rail means project downward from the bottom of said bowl and terminate in proximity to the path of movement of said blade to prevent the blade from falling from said finger when the blade is out of its closed position under said toilet bowl.

6. Toilet apparatus that is defined in claim 4, wherein said bowl has a downwardly projecting flange defining said outlet, said seal member is an elastomeric sleeve attached to and projecting below the lower edge of said flange and terminating in a tapered lower edge, and said blade is movable in a horizontal plane containing the projecting portion of said elastomeric sleeve and has a beveled edge engageable with said tapered lower edge during movement in said plane.

7. Toilet apparatus that is defined in claim 1, wherein said actuating means is rotatable about the vertical axis of said crank and is vertically movable against said spring means as an initial step in rotating the shaft in one direction and thereby moving said blade toward one side of the bowl outlet.

8. Toilet apparatus that is defined in claim 7, wherein said housing includes a vertical stop member under which said actuating means is rotated when the actuating means is depressed against the action of said spring means and is rotated to the open position of said blade.

9. Toilet apparatus that is defined in claim 8, wherein said spring means urges said actuating means upward into engagement with said vertical stop member for retaining the actuating means in a fixed position when the user of the toilet apparatus releases the actuating means while the latter is in the open position of said blade.

10. Toilet apparatus that is defined in claim 9, wherein said housing contains a flush water tank and a manually actuated flush mechanism for discharging flush water from said tank into said bowl, said flush mechanism being manually actuable when said actuating means is retained in said fixed position.

11. Toilet apparatus that is defined in claim 1, wherein said housing has a vent opening adjacent to said actuating means, and a vent seal closing said vent opening, said vent seal being responsive to said actuating means to open when said actuating means is operated to move said blade to its open position.

12. Toilet apparatus that is defined in claim 11, wherein said housing defines a holding tank under said bowl, and said vent seal is responsive to open as an incident to the initial movement of said actuating means for opening the blade so that pressure that may exist within the holding tank will be released initially through said vent opening.

13. Toilet apparatus that is defined in claim 1, wherein said bowl has a downwardly projecting flange defining said outlet, and said seal member is an elastomeric sleeve stretched around the radially outer side of said flange and projecting below the the lower edge of said flange as an elastic curtain, and said blade is movable in a plane containing the elastic curtain so that the curtain can scrape along the top surface of the blade to clean off foreign particles.

14. Toilet apparatus that is defined in claim 1, wherein said crank is supported in suspended relationship from an upper portion of said housing adjacent to said actuating means for rotation about the axis of said shaft, and a guide plate is mounted on the bottom wall of said bowl and has an aperture therein through which said vertical shaft extends for limiting the shaft to rotary and axial movements.

* * * * *

UNITED STATES PATENT OFFICE
CERTIFICATE OF CORRECTION

Patent No. 4,032,996          Dated July 5, 1977

Inventor(s) Frank T. Sargent, John M. Antos

It is certified that error appears in the above-identified patent and that said Letters Patent are hereby corrected as shown below:

[75] Inventors: "Frak T. Sargent" should be --Frank T. Sargent--.

Column 4, line 44, "In the conventional, a closure cap 94" should be --In the conventional manner, a closure cap 94--.

Signed and Sealed this

Eighteenth Day of October 1977

[SEAL]

Attest:

RUTH C. MASON
*Attesting Officer*

LUTRELLE F. PARKER
*Acting Commissioner of Patents and Trademarks*